(12) United States Patent
Jacobson

(10) Patent No.: US 10,547,172 B2
(45) Date of Patent: Jan. 28, 2020

(54) CROWBAR PROTECTION CIRCUIT WITH DISCHARGE RATE CONTROL

(71) Applicant: Raytheon Company, Waltham, MA (US)

(72) Inventor: Boris S. Jacobson, Marlborough, MA (US)

(73) Assignee: RAYTHEON COMPANY, Waltham, MA (US)

( * ) Notice: Subject to any disclaimer, the term of this patent is extended or adjusted under 35 U.S.C. 154(b) by 310 days.

(21) Appl. No.: 15/496,759

(22) Filed: Apr. 25, 2017

(65) Prior Publication Data

US 2018/0309285 A1 Oct. 25, 2018

(51) Int. Cl.
*H02H 9/02* (2006.01)
*H02H 9/04* (2006.01)
*H03K 17/082* (2006.01)

(52) U.S. Cl.
CPC .............. *H02H 9/042* (2013.01); *H02H 9/02* (2013.01); *H02H 9/041* (2013.01); *H02H 9/048* (2013.01); *H03K 17/0824* (2013.01)

(58) Field of Classification Search
USPC ........................................ 361/91.1, 117–119
See application file for complete search history.

(56) References Cited

U.S. PATENT DOCUMENTS

| | | | | | |
|---|---|---|---|---|---|
| 3,609,402 | A | * | 9/1971 | Ferro ..................... | H03K 3/352 327/190 |
| 3,729,652 | A | * | 4/1973 | St. Clair .................. | H02H 9/04 361/118 |
| 3,742,337 | A | * | 6/1973 | Digneffe ............... | H02M 1/081 323/300 |
| 3,979,644 | A | * | 9/1976 | Everhart .................. | H02H 3/20 361/91.6 |

(Continued)

FOREIGN PATENT DOCUMENTS

GB   2 273 832 A   6/1994

OTHER PUBLICATIONS

Tools & Software: "LM431 Ajustable Precision Zener Shunt Regulator datasheet (Rev. H)", Jan. 6, 2016, Retrieved from the Internet: URL:http://www.ti.com.cn/cn/lit/ds/symlink/lm431.pdf (retrieved Jul. 16, 2018) (pp. 1-36).

(Continued)

*Primary Examiner* — Danny Nguyen
(74) *Attorney, Agent, or Firm* — Lewis Roca Rothgerber Christie LLP

(57) ABSTRACT

A crowbar circuit includes a first inductor coupled to a positive terminal of a power supply at a first terminal, and at a second terminal coupled in series with a main thyristor having a main gate drive for limiting a discharge current through main thyristor; a resistor coupled to the main thyristor at a first terminal and to the negative terminal at a second terminal; an auxiliary thyristor having an auxiliary (Continued)

gate drive coupled in series with a first capacitor at a first terminal and an auxiliary inductor at a second terminal, the auxiliary inductor coupled between the first terminal of the resistor and the first capacitor; a first diode couple between the first terminal of the resistor and the first terminal of the auxiliary thyristor; and a second diode coupled between the positive terminal and the negative terminal.

19 Claims, 6 Drawing Sheets

(56) References Cited

U.S. PATENT DOCUMENTS

| | | | |
|---|---|---|---|
| 4,016,458 A * | 4/1977 | Everhart | H02H 3/20 361/18 |
| 7,839,201 B2 | 11/2010 | Jacobson | |
| 8,773,231 B2 | 7/2014 | Jacobson et al. | |

OTHER PUBLICATIONS

Invitation to Pay Additional Fees for corresponding International Application No. PCT/US2018/028018, filed Apr. 17, 2018, Invitation to Pay Additional Fees dated Jul. 24, 2018 (12 pgs.).
International Search Report for corresponding International Application No. PCT/US2018/028018, filed Apr. 17, 2018, International Search Report dated Jul. 17, 2018 and dated Oct. 4, 2018 (7 pgs.).
Written Opinion of the International Searching Authority for corresponding International Application No. PCT/US2018/028018, filed Apr. 17, 2018, Written Opinion of the International Searching Authority dated Oct. 4, 2018 (10 pgs.).

* cited by examiner

CROWBAR PROTECTION CIRCUIT WITH DISCHARGE RATE CONTROL

FIELD OF THE INVENTION

The present invention relates generally to electronic circuits for surge protection and more particularly, to a crowbar protection circuit with discharge rate control.

BACKGROUND

A variety of military and commercial applications including communications, sensing and vehicle hubs require scalable, reliable power grid based on power branching units (PBUs). When these applications include PBUs in remote and hard-to-access areas, such as under see, rugged mountains, or rural areas, the PBUs require a very long period between service time and thus need to be reliably protected from electromagnetic pulse (EMP)-type surges caused by cable breakdowns, hostile environment, etc. Typically, these systems primarily operate from a constant current source remotely located from the PBUs. Such systems, where a single trunk (backbone) cable feeds many loads in series, may extend to hundreds or thousands of miles.

An EMP can occur as a radiated, electric or magnetic field or a conducted electric current, depending on the source. EMP interference is generally disruptive or damaging to electronic equipment, and at higher energy levels a powerful EMP event, such as a lightning strike, a cable breakdown, can damage physical objects, such as the PBUs. For example, any cable breakdown interrupts the current and releases the energy stored in the cable and therefore creating an equipment-damaging power surge. Electronic clamps internal to PBUs are incapable of sustaining power surges in the range of hundreds of kilowatts. Moreover, conventional clamping protectors, for example, metal oxide varistors (MOVs) do not have adequate reliability and volumetric characteristics.

Conventional approaches apply an emergency crowbar circuit across the PBUs for the surge duration, where the (surged) current flows through the crowbar bypassing the PBUs during surges. Power crowbar circuits typically use a large vacuum tube (i.e. Ignitron) or a thyristor to short the current path. However, vacuum tubes are large and expensive, while thyristors are smaller and offer lower cost, but they latch when triggered and stay on until the power is removed. When latched, thyristors or silicon controlled rectifier (SCR)-based circuits are not capable of removing the short circuit when the power surge is over. Also, transistor-base circuits lack the overcurrent capabilities of SCR-forced-commutated circuits using gate turn off (GTO) thyristors and have to operate with reduced reliability for high voltage and/or current rates (dv/dt and di/dt). In other words, when the crowbar is triggered, stored energy in the system has to be dissipated, while the surge current being dissipated is not controlled. However, the crowbar shall not interrupt the current flow in constant-current systems. The advantage of a crowbar circuit over a clamp circuit is that the low holding voltage of the crowbar circuit lets it carry higher fault current without dissipating much power (which could otherwise cause overheating). Also, a crowbar circuit is more likely than a clamp circuit to deactivate a device (by blowing a fuse or tripping a breaker), bringing attention to the faulty equipment.

FIG. 2 shows a typical crowbar circuit 200. As shown, an adjustable Zener diode (regulator) 202 controls the gate of a bidirectional triode thyristor (TRIAC) 204. The $R_1$ and $R_2$ resistor divider provides a reference voltage for the Zener diode 202. The $R_1$ and $R_2$ resistor divider is set so that during normal operating conditions, the voltage across $R_2$ is slightly lower than $V_{REF}$ of the Zener diode 202. Since this voltage is below the minimum reference voltage of the Zener diode, the Zener diode remains off and thus very little current is conducted through the diode and its cathode resistor 206. If the cathode resistor 206 is sized accordingly, very little voltage will be dropped across it and the TRIAC gate terminal 208 will be at the same potential as main terminal 109 of the TRIAC, keeping the TRIAC off. If the supply voltage 210 increases, the voltage across $R_2$ will exceed $V_{REF}$ and the Zener diode 202 begins to regulate the voltage, drawing more current through it. The voltage at the gate terminal 208 is then pulled down to the Zener diode voltage, exceeding the gate trigger voltage of the TRIAC and latching it on. When the crowbar is activated, the surge current deactivates the device (e.g., a PBU) by blowing a fuse 212 or tripping a breaker.

Once a crowbar circuit is triggered, it pulls the voltage below the trigger level, typically close to ground voltage level. Accordingly, a crowbar circuit does not automatically return to normal operation when the overvoltage condition is removed, unless the power is removed entirely to stop its conduction. In contrast, a clamp circuit prevents the voltage from exceeding a preset level.

SUMMARY

In some embodiments, the disclosed invention is a crowbar circuit that includes: a positive terminal and a negative terminal couple to respective terminals of a power supply and a load; a first inductor coupled to the positive terminal at a first terminal, and at a second terminal coupled in series with a main thyristor having a main gate drive for limiting a discharge current through main thyristor; a resistor coupled to the main thyristor at a first terminal and to the negative terminal at a second terminal; an auxiliary thyristor having an auxiliary gate drive coupled in series with a first capacitor at a first terminal and an auxiliary inductor at a second terminal, the auxiliary inductor coupled between the first terminal of the resistor and the first capacitor; a first diode couple between the first terminal of the resistor and the first terminal of the auxiliary thyristor; and a second diode coupled between the positive terminal and the negative terminal.

In some embodiments, the disclosed invention is a method for controlling current in a crowbar circuit, the crowbar circuit including a controllable inductor and a load having a load capacitance and a load diode. The method includes: monitoring a current in the load capacitance and a current in the load diode; when any of the currents in the load capacitance or the load diode exceeds a respective threshold value, reducing the current that exceeds the respective threshold value by increasing a value of the controllable inductor; calculating a parameter for a safe operating area (SOA) of components of the load; comparing the calculated parameter with a safety threshold; and increasing a discharge current from the load capacitance or the load diode by decreasing the value of the controllable inductor.

In some embodiments, the disclosed invention is a method for controlling current in a crowbar circuit, the crowbar circuit including a controllable inductor and a load having a load capacitance and a load diode. The method includes: turning on a first thyristor, when a surge current in an input power supply is detected; discharging a current through the controllable inductor to dissipate the surge current; and turning on a second thyristor to turn off the first thyristor, when the surge current is dissipated below a predetermined threshold.

BRIEF DESCRIPTION OF THE DRAWINGS

These and other features, aspects, and advantages of the disclosed invention will become better understood with regard to the following description, appended claims, and accompanying drawings.

DETAILED DESCRIPTION

Figure 1:
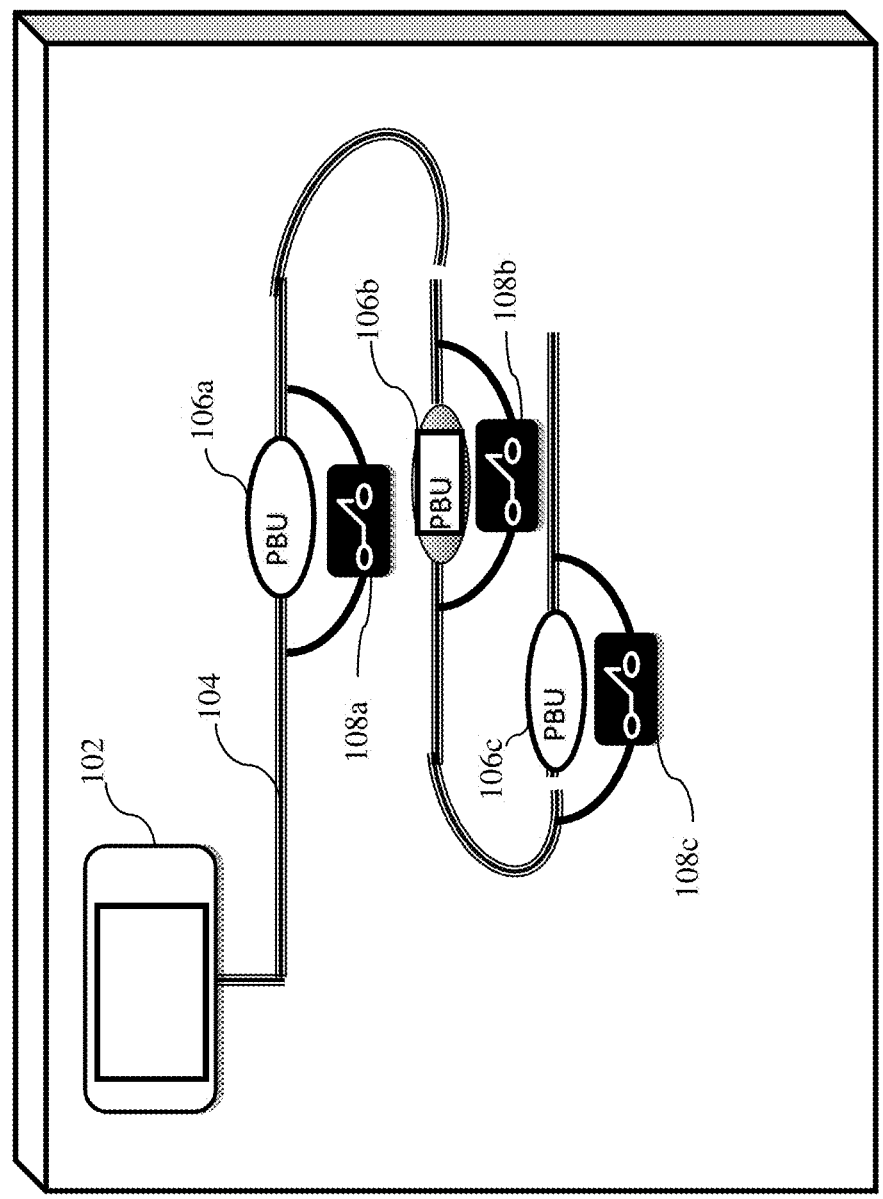
FIG. 1 illustrates a power distribution system including a plurality of power branching units (PBUs), according to some embodiments of the disclosed invention.
Figure 2:
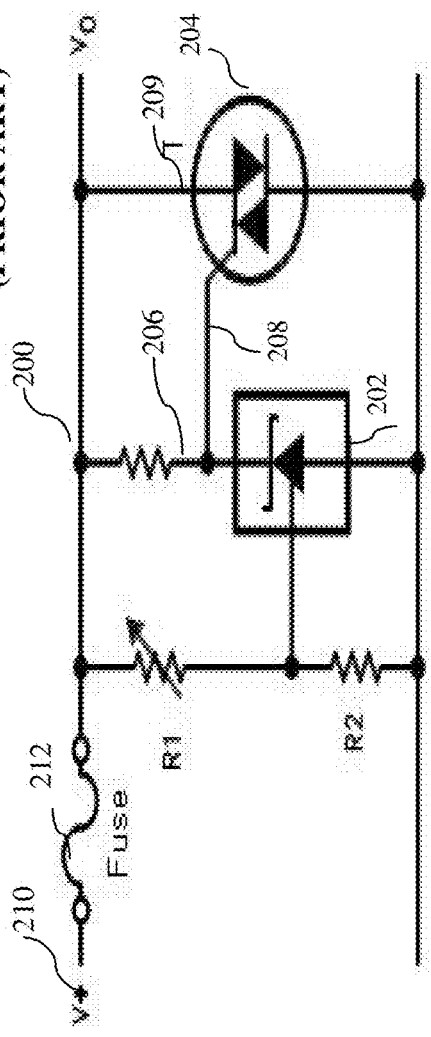
FIG. 2 shows a typical crowbar circuit.

FIG. 1 illustrates a power distribution system 100 including a plurality of power branching units (PBUs), according to some embodiments of the disclosed invention. As shown in a power supply 102, for example, a constant current source, is supplying power to a trunk cable 104. A plurality of PBUs 106a, 106b and 106c are connected in series to the cable 104. Each of the PBUs include a crowbar circuit (108a, 108b and 108c, respectively) across them, according to the disclosed invention. During a power surge, the crowbar circuits are triggered (turned on) and the (surged) current flows through the crowbar circuits bypassing the respective PBUs. The crowbar circuits 108a, 108b and 108c are then turned off causing the power distribution system 100 to resume its normal operation, as described below.

In some embodiments, the disclosed invention utilizes a naturally-commutated topology with resonant circuits connected in parallel to a first (main) thyristor to reduce stress and improve system-level reliability. This improved crowbar topology uses parallel commutation of the main thyristor which does not interrupt the current flow in the trunk cable. The enhanced crowbar topology commutates (reverse the direction of the current of) the main thyristor using a second (auxiliary) thyristor, an LC circuit and a resistor to turn on the second thyristor and turn off the main thyristor. This maintains an uninterrupted current flow in the trunk cable and provides a dynamic adjustment of the discharge current rate for optimum operation. A controller monitors peak discharge currents and power dissipation in the loads and input devices and keeps components within their safe operating area (SOA) by controlling discharge currents using an adjustable inductor.

In some embodiments, the disclosed invention includes energy recovery circuit that transfers stored energy in the system to an auxiliary energy storage element.

Figure 3:
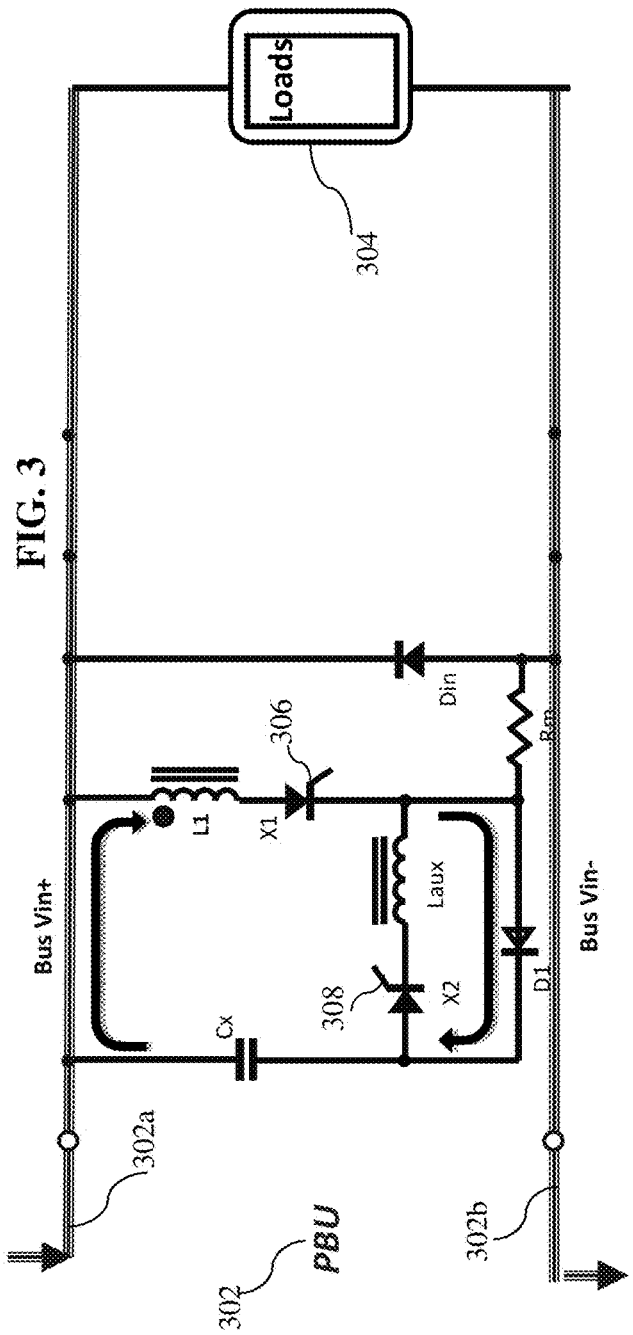
FIG. 3 is a simplified circuit diagram of a crowbar, according to some embodiments of the disclosed invention.

FIG. 3 is a simplified circuit diagram of a crowbar, according to some embodiments of the disclosed invention. As shown, a power supply delivers energy (e.g., voltage) at its respective terminals 302a and 302b to one or more loads 304 (PBUs). An inductor L1 is coupled to the positive terminal 302a at one end and at the other end, coupled in series with a main thyristor X1 having a gate drive 306 to limit the discharge current through thyristor X1. Thyristor X1 is also coupled to the negative terminal 302b via a resistor Rm. An auxiliary thyristor X2 having a gate drive 308 is coupled in series with a capacitor Cx at one end and an auxiliary inductor $L_{aux}$ and a first diode D1. The first diode D1 is coupled in parallel with X2 and $L_{aux}$ between capacitor Cx and resistor Rm. A second diode $D_{in}$ is coupled in parallel with L1 and X1 between the resistor Rm and the positive terminal 302a.

This crowbar circuit commutates the main thyristor X1 using the auxiliary thyristor X2, the LC circuit (Cx and L) and resistor Rm. Prior to turn-on of the thyristor X1, the capacitor Cx is positively charged (by node 302A), the diode D1 is negatively biased (in the off state) and no component in the circuit carries a significant current. When X1 turns on due to a surge in the input power supply delivered energy, current through resistor Rm creates negative voltage across capacitor Cx, and current starts to build up in the inductor L1. As a result, an energy storage unit (which may be just the capacitor Cin, shown in FIG. 4) starts discharging through the resistor Rm causing the voltage across the thyristor X2 to start declining as well as anode-to-cathode ("negative") voltage across D1.

When the voltage across D1 turns positive, D1 turns on and the capacitor Cx starts discharging through the diode D1 and the inductor L1. As current flows through Cx, L1 and D1, the input voltage $V_{in}$ declines ($V_{in}=V_{Cx}+V_{D1}+V_{Rm}$). When Vin drops below the threshold voltage of the input diode Din, Din turns on, current in Cin goes to zero, the inductor L1 current starts declining and Cx is fully recharged to a negative voltage $V_{Cxneg}=V_{Rm}$. Subsequently, currents in D1 and Cx drop to zero, currents in Rm, Din and L1 gradually decline, and negative (anode-to-cathode) voltage is applied to X1 while positive (anode-to-cathode) voltage builds up across X2 that remains in the off state. The circuit can remain in this state for the duration of the transient, but the main limitation is a potential loss of voltage across C1 caused by a leakage current. However, the time needed for a substantial loss of charge in a low-leakage high voltage capacitor is in the order of magnitude longer than the duration of practical transients.

When the crowbar circuit senses that the transient has dissipated, it turns on the thyristor X2. That in turn applies the negative voltage stored in Cx to X1 (negative voltage is applied to the anode of X1) and triggers a discharge of Cx through Laux, D1 and Rm. Notably, the duration of this discharge shall be greater than the time required for X1 to restore its voltage-blocking capability (for thyristors, this time is normally specified as tq). Circuit parameters defining this time interval (Rm, Laux and Cx) are selected according to this requirement. In summary, X1 is turned off when X2 is turned on by the negative voltage across capacitor Cx. Capacitor Cx applies negative voltage across the main thyristor X1 during its turn-off achieving parallel commutation of X1.

In some embodiments, the crowbar circuit optionally includes a current control circuit including a regulated inductor L1. A controller (shown in FIG. 4) monitors peak discharge currents and power dissipation in the loads (for example, Clamp1, Clamp2) and input devices (PBUs) and keeps components within their safe operating area (SOA) by controlling discharge currents using the optional regulated (adjustable) inductor L1. This way, an uninterrupted current flow is maintained in the trunk cable and (optionally) provides a dynamic adjustment of the discharge rate for optimum operation. This crowbar circuit does not interrupt the current flow from the power supply and therefore there is no interruption in the operation of the PBUs.

The clamps of the loads may use a controllable semiconductor device (e.g., an intelligent transistor-based switch) described in detail in U.S. Pat. No. 7,839,201, the entire contents of which is hereby expressly incorporated by reference. The device includes a controllable semiconductor, a sensor, and a controller for controlling at least one operating parameter of the device. The controllable semiconductor (for example, a transistor) has a first operating parameter (e.g., current) and a second operating parameter (e.g., power), where at least the first operating parameter (e.g., current) is controllable. The (power/voltage) sensor acquires data relating to the second operating parameter (e.g., power) of the transistor (load). The controller accesses device data associated with the transistor, controls its current, and receives data from the sensor relating to the second operating parameter. The controller then determines a first predicted value dependent on the device data, compares the data relating to the second operating parameter with the first predicted value, and if a first condition is detected based on the comparison, dynamically modifies the current through the transistor(load).

Figure 4:
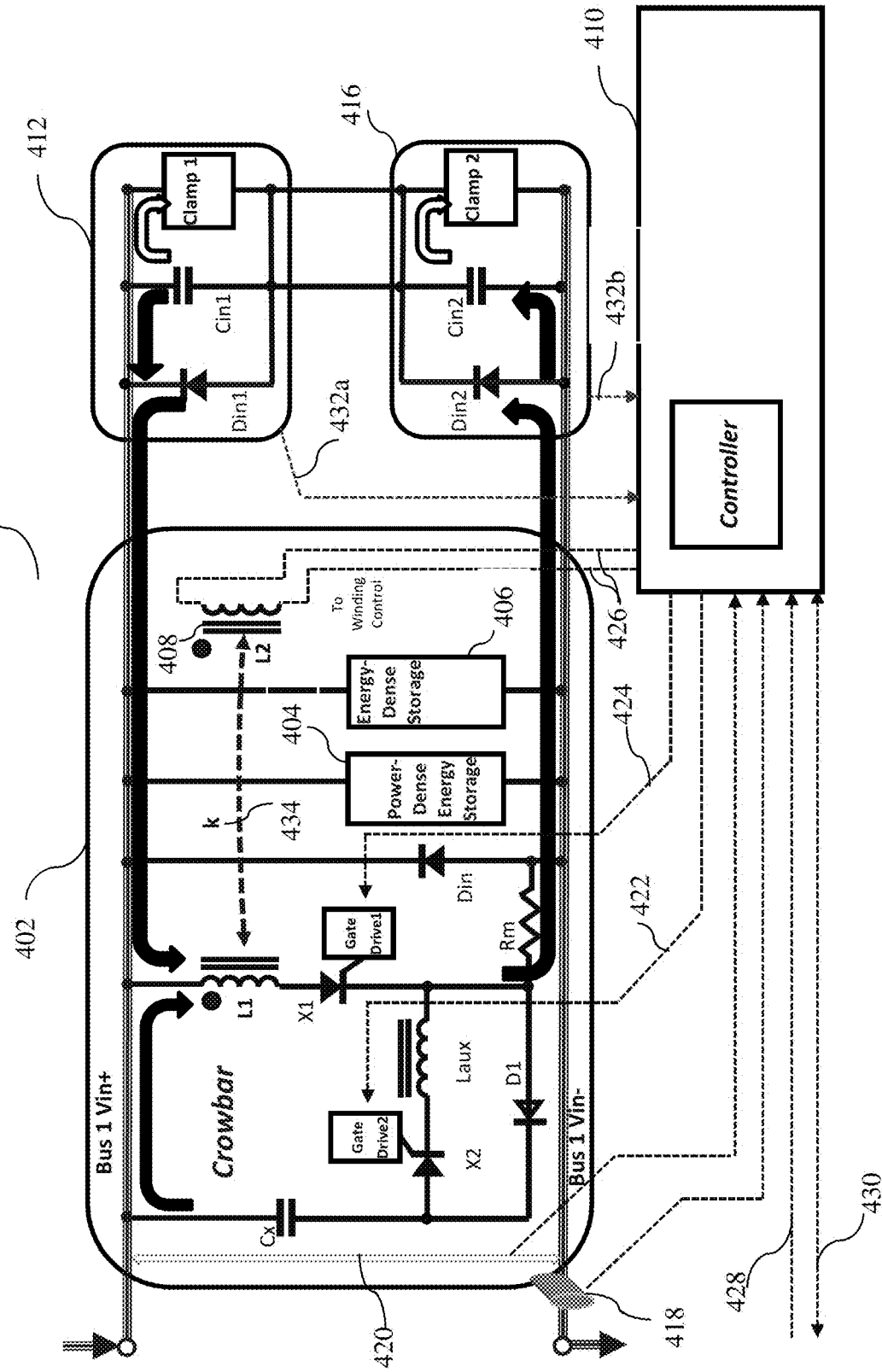
FIG. 4 shows a circuit diagram of a crowbar with controlled discharge rate, according to some embodiments of the disclosed invention.

FIG. 4 shows a circuit diagram of a crowbar with controlled discharge rate 400, according to some embodiments of the disclosed invention. The front stage of the crowbar circuit 402 (i.e., L1, X1, X2, $L_{aux}$, Rm, D1, Din and Cx) is similar to that depicted in FIG. 3 and described above. However, in these embodiments, an optional high power dense energy storage circuit 404 and an optional energy storage circuit 406 are added to the crowbar circuit 402. For example, a capacitor may serve as a power dense energy storage 404, while a battery may serve as an energy dense storage 406. A capacitor can quickly receive and release energy, while a battery may be damaged by high current intrinsic in a fast energy transfer. A second controllable inductor L2 with a coupling factor K434 between L2 and L1 is controlled by the controller 410. The coupling factor K simply indicates that the two inductors (coils) L1 and L2 share a common core, but the actual magnetic coupling between the two windings (the control winding L1 and the power winding L2) is negligible.

Circuits and methods of implementing controllable inductors are described in detail in U.S. Pat. No. 8,773,231, the entire contents of which are hereby expressly incorporated by reference. For example, a controllable inductor may include a multiphase inductor having a central winding, a first control winding, and a second control winding, and a control portion. The control portion may include a first control logic portion to receive a signal indicative of a first current of the first control winding and a signal indicative of a second current of the sum of the first control winding and the second control winding. The control portion modulates a first pulse width modulated signal to responsively control a first transistor connected to the first control winding, and a second control logic portion to receive the signal indicative of the first current of the first control winding and a signal indicative of the second current of the sum of the first control winding and the second control winding. The control portion also modulates a second pulse width modulated signal to responsively control a second transistor connected to the second control winding.

Referring back to FIG. 4, the load(s) 304 in FIG. 3 are modeled here by two exemplary converters 412 and 416. Each converter includes a diode ($D_{in1}$, $D_{in2}$), a capacitor ($C_{in1}$, $C_{in2}$) and a clamp (Clamp1 and Clamp2). The clamps' functions are to limit the surge voltage at a safe level for other converter components for a short time interval (e.g., microseconds). However, an extended activation of the clamp is prohibitively difficult, because of high power dissipation and components' volume required. Operation of Cin and Din is described above.

A controller circuit (including associated circuitry, e.g., CPU, memory and I/O) 410 receives input current and input voltage values from a current sensor 418 and a voltage sensor 420, respectively. The controller circuit 410 also receives external commands 428, temperature and power dissipation information from the loads/clamps (converters 412 and 416) from respective temperature and power sensors (not shown). The controller then uses the above input information to provide the gate currents to thyristors X1 and X2 and to control the current through the inductor L2, for example, by changing its current.

In these embodiments, the controller circuit 410 balances two conflicting requirements of reducing the power dissipation in the clamps (higher discharge currents speed up the crowbar) and reducing the stress caused by high discharge currents in converters' components. For example, a 2 kW PBU may have discharge currents in the range of hundreds of amperes, which may cause damage to the loads. The controller circuit 410 monitors peak discharge currents and power dissipation in clamps of the converters and input devices, and keeps components of the crowbar circuit and the loads within their SOA by controlling discharge currents using the adjustable indictor L1. For example, in the event of a transient (burst), the controller detects an overvoltage across Bus 1 or an overcurrent in the feeding cable and activates the crowbar circuit. During the corresponding initial time interval, clamps in individual converters inside the PBU would regulate the bus voltage by dissipating excess power.

Figure 6:
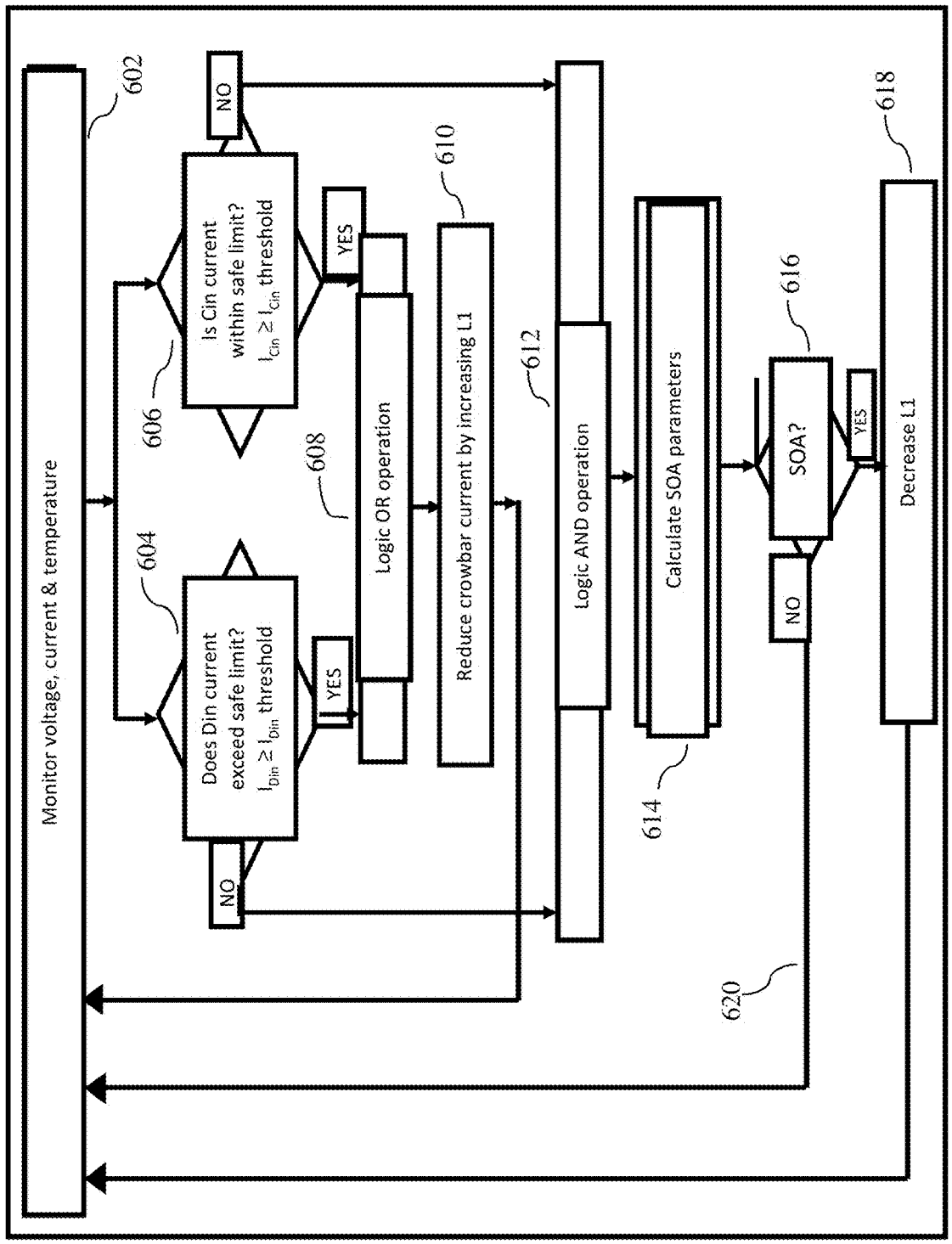
FIG. 6 shows a process flow for a controller, according to some embodiments of the disclosed invention.

FIG. 6 shows processor flow for a controller according to some embodiments of the disclosed invention. As shown in block 602, the controller continuously monitors peak currents, voltage and temperature in the converter input components (Din and Cin) and compares the measured data to their thresholds. If either current is excessive, for example, exceeding a respective threshold value (blocks 604, 606 and 608), the controller reduces the current by increasing the value of L1, in block 610. If both currents are within limits (block 612), the controller calculates SOA parameters for the clamp(s), in block 614. The controller then compares the SOA parameters with the corresponding (predetermined) thresholds, in block 616. If the SOA parameters are within their limits (thresholds), the controller returns (620) to block 612 and resumes monitoring peak currents in the converter input components. If the measured SOA exceeds its limits, the controller reduces the value of L1 to speed up the discharge of capacitors Cx and Cin by increasing the peak current, in block 618 and returns to the first step (622).

This way, the discharge rate for the crowbar circuit is dynamically adjusted for optimum operation of the crowbar and the PBUs.

Figure 5:
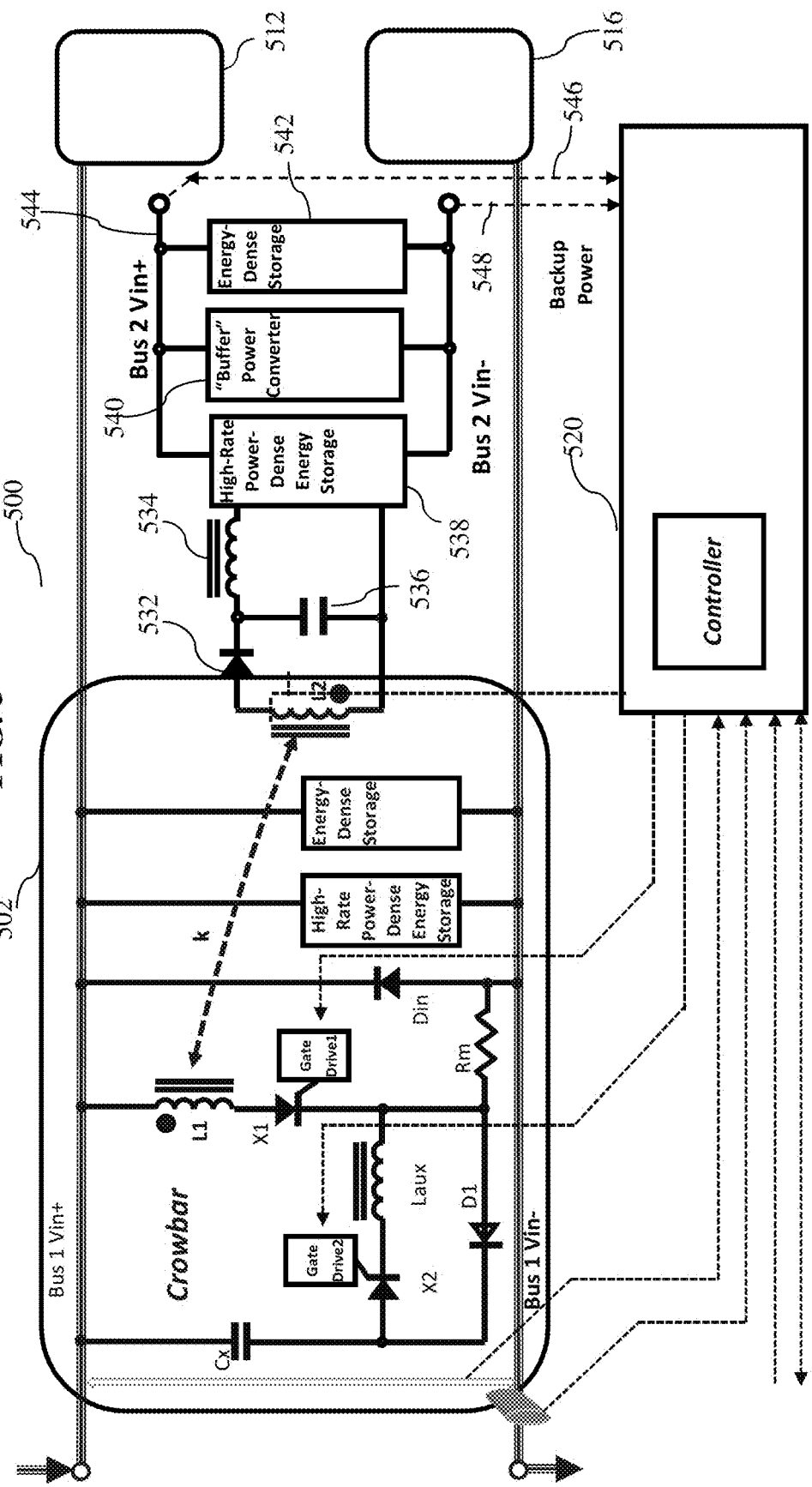
FIG. 5 depicts a circuit diagram of a crowbar with energy recovery circuit, according to some embodiments of the disclosed invention.

FIG. 5 depicts a circuit diagram of a crowbar with energy recovery circuit 500, according to some embodiments of the disclosed invention. The crowbar circuit 502 (including the two energy storage circuits and L2) is similar to that depicted in FIG. 4 and described above. In these embodiments, an optional energy recovery circuit is added to the crowbar circuit 502. This energy recovery circuit regenerates energy stored in the PBU local bus (Bus 1) when the crowbar circuit is activated. The energy stored in Bus 1 is then transferred to another bus (Bus 2) via an additional winding of the inductor L1, i.e., L2. During the discharge of the capacitor Cx, its voltage crosses zero and turns negative. At this time, the voltage across the coupled inductor L2 turns positive, the diode 532 becomes forward biased and starts charging up the capacitor 536. At the same time, current begins building up in the inductor 534 and starts flowing into the energy storage 538 and thus initiating the energy recovery process. Following a common practice, a series LR network (not shown) may be connected in parallel with L2 to suppress oscillation during these transient events. When the diode D1 becomes forward biased, current in the inductor L1 goes to zero and therefore terminating the energy transfer. Bus 2 may serve as a backup source for the PBU controller (shown by power lines 546 and 548) or transfer energy to storage external to PBU, for example, by using a commercially available isolated DC/DC converter.

Figure 7:
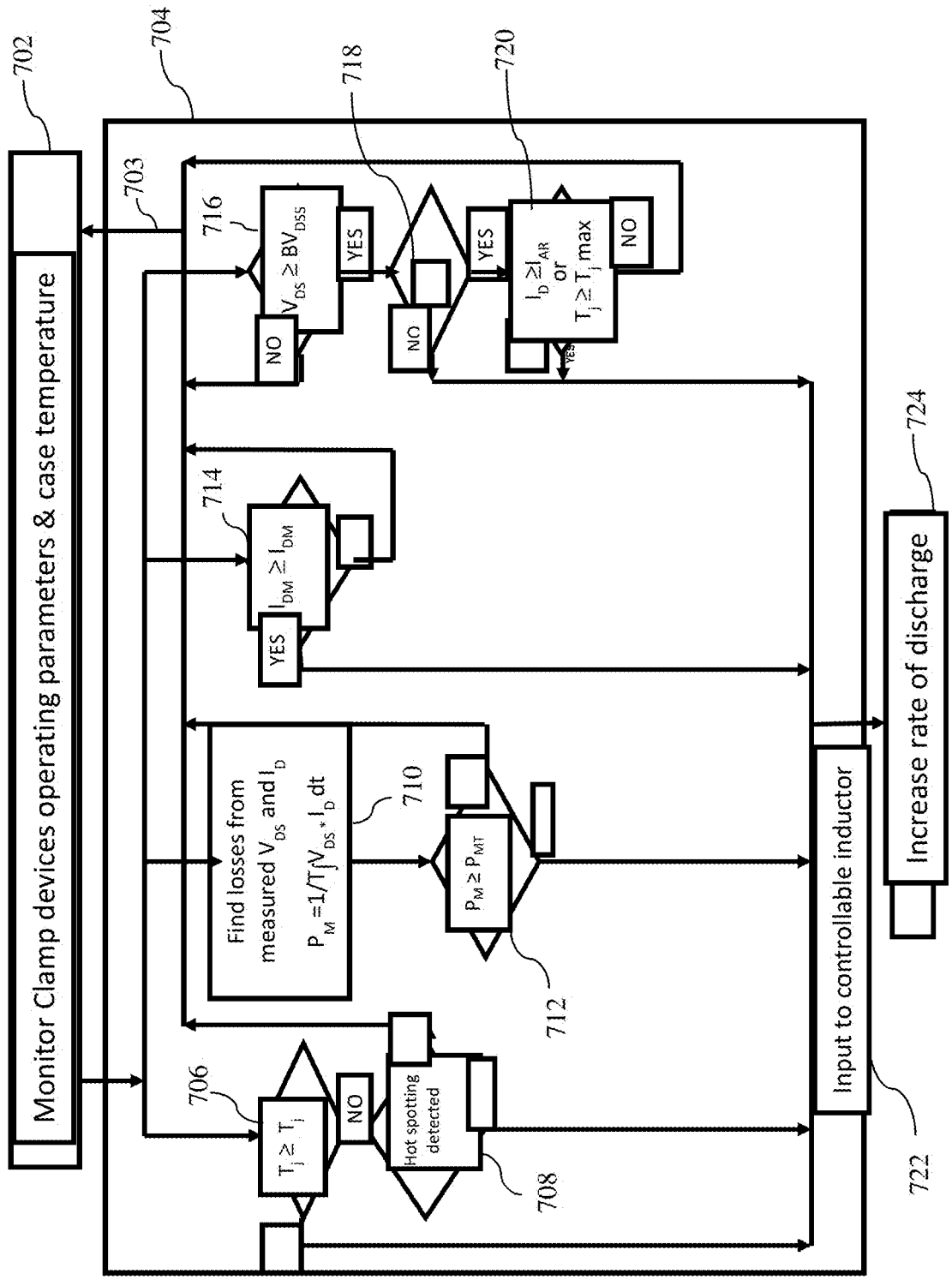
FIG. 7 illustrates a process flow diagram of a crowbar circuit which keeps components within their safe operating area (SOA), according to some embodiments of the disclosed invention.

FIG. 7 illustrates a process flow diagram of a crowbar circuit which keeps clamps' transistors within their safe operating area (SOA), according to some embodiments of the disclosed invention. As described above, a controller monitors peak discharge currents and power dissipation in the loads and input devices and keeps components within their safe operating area (SOA) by controlling discharge currents using an adjustable inductor. This protection process can be adapted for the protection of virtually any type of power device, as those of skill in the art will appreciate. As shown in block 702, the peak discharge currents and/or power dissipation in the loads are sensed and monitored. After the clamp(s) and operating parameters are monitored, the process splits its protection tasks into four sub processes (where the sub process may operate concurrently, but are not required to do so): over-temperature and current tunneling protection (first branch from the left side), excessive power protection (second branch), over-current protection (third branch), and over-voltage protection (fourth branch).

In the over-temperature and current tunneling protection branch, (blocks 706 and 708), the controller checks (block 706) whether the junction temperature ($T_J$) in the transistor (of the load) is greater than or equal to the $T_J$ threshold (as determined by the device data). If $T_J$ is greater than or equal to the $T_J$ threshold, then the controller increases the rate of discharge in the transistor in block 724. If $T_J$ is not greater than or equal to the $T_J$ threshold, then the controller checks whether hot spotting (also referred to as current tunneling) has been detected in the clamp's transistors, in block 708. This can be done in several different ways, as those of skill in the art will appreciate. For example, the controller can check for (a) variations in the current density and temperature across the device; (b) whether some locations of the die of the clamp transistors, especially near the center of the die, start running with a lower transistor gate threshold voltage $V_{th}$; and/or (c) a localized increase in current density (caused by higher forward transconductance) in any part of the clamp devices.

If hot spotting/current tunneling has not been detected, then the protection process goes back to block 702 (703). If, however, block 708 shows that hot spotting/current tunneling has been detected, the controller increases the rate of discharge of capacitors Cx and Cin by increasing the peak current using the controllable inductor, in block 724. If load characteristics allow operation with pulsed current, the controller then changes the mode of the transistor to a switching mode, in block 722, and jumps back to block 702.

In the excessive power protection branch, the controller finds total transistor losses $P_M$ (block 710) from two measured operating parameters: drain to source voltage ($V_{DS}$) and drain current $I_D$. This can be done in several ways, such as by integrating the product of its instantaneous voltage and current over the time interval T. If the clamp is switching with fixed frequency, the time interval T is the period of the switching frequency. If the clamp operates in the linear mode or switching mode with variable frequency, the power dissipation of the clamp's components is found by averaging losses over a time interval that preferably includes a number of turn on and turn off events. If the total loss $P_M$ exceeds or is equal to the loss $P_M$ threshold (block 712), then the controller increases the rate of discharge of capacitors Cx and Cin by increasing the peak current using the controllable inductor, in block 724. If, however, the total loss $P_M$ is less than the loss threshold, then the process jumps back to block 702.

In the over current protection branch, the controller checks whether the pulse current $I_{DM}$ exceeds or is equal to the threshold, in block 714. If the pulse current $I_{DM}$ does not exceed the threshold, then the process jumps back to block 702. If the pulse current $I_{DM}$ exceeds the threshold, the controller increases the rate of discharge of capacitors Cx and Cin by increasing the peak current using the controllable inductor, in block 724.

In the over-voltage protection branch, the controller checks the clamp transistor's drain to source over-voltage $V_{DS}$ (block 716) to see if it is less than the device's breakdown voltage $V_{DSS}$. For example, one way the controller can do this is by measuring leakage current (e.g., via a current sensor). If the transistor voltage $V_{DS}$ is less than its breakdown voltage, $V_{DSS}$, the method goes back to block 702. If $V_{DS}$ is greater or equal than its breakdown voltage, the controller checks for an avalanche condition (block 718). One way to check for this is to check whether drain to source voltage $V_{DS}$ is constant while drain current flows through the clamp's transistor. If $V_{DS}$ is not constant (and if the conditions of block 716 are satisfied) there is no avalanche condition in the clamp's transistor, and the most likely outcome is failure of the clamp. Thus, if no avalanche condition is detected in block 718, the controller increases the rate of discharge of capacitors Cx and Cin by increasing the peak current using the controllable inductor (block 724).

If, however, the $V_{DS}$ is staying constant, substantially decaying drain current flows through the controllable semiconductor, and the conditions of block 716 are met, then the clamp's transistor is in an avalanche condition. The controller then checks (block 720) whether the drain current $I_D$ is greater than or equal to the avalanche current $I_{AR}$ or whether the junction temperature $T_J$ is greater than or equal to the maximum junction temperature, $T_J$ max (block 720). If either of these conditions is met, then the clamp's transistor is approaching failure, and the controller increases the rate of discharge of capacitors Cx and Cin by increasing the peak current using the controllable inductor (block 724). If neither of the conditions in block 720 is met, then the method jumps back to block 702.

It will be recognized by those skilled in the art that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope of the invention as defined by the appended claims and drawings.

What is claimed is:

1. A crowbar circuit comprising:
a positive terminal and a negative terminal coupled to respective terminals of a power supply and a load;
a first inductor coupled to the positive terminal at a first terminal, and at a second terminal coupled in series with a main thyristor having a main gate drive for limiting a discharge current through the main thyristor;
a resistor coupled to the main thyristor at a first terminal and to the negative terminal at a second terminal;
an auxiliary thyristor having an auxiliary gate drive coupled in series with a first capacitor at a first terminal and an auxiliary inductor at a second terminal, the auxiliary inductor coupled between the first terminal of the resistor and the first terminal of the first capacitor;
a first diode coupled between the first terminal of the resistor and the first terminal of the auxiliary thyristor; and
a second diode coupled between the positive terminal and the negative terminal.

2. The crowbar circuit of claim 1, wherein a current of the first inductor is controllable.

3. The crowbar circuit of claim 2, further comprising a controller circuit to dynamically adjust the current of the first inductor.

4. The crowbar circuit of claim 3, further comprising a current sensor for measuring current through the positive terminal and the negative terminal.

5. The crowbar circuit of claim 4, further comprising a voltage sensor for measuring voltage between the positive terminal and the negative terminal.

6. The crowbar circuit of claim 5, wherein the controller circuit provides current to the main gate drive of the main thyristor and auxiliary gate drive of the auxiliary thyristor to keep components of the load in a safe operation area, based on one or more of the current through the positive terminal and the negative terminal, the voltage between the positive terminal and the negative terminal, and an external command.

7. The crowbar circuit of claim 5, wherein the controller circuit monitors peak discharge currents and power dissipation in the load and input devices, and keeps components of the crowbar circuit and the load within in a safe operation area by controlling discharge currents, using the controllable first inductor.

8. The crowbar circuit of claim 1, further comprising a second controllable inductor with a coupling factor to the first controllable inductor, controlled by the controller circuit.

9. The crowbar circuit of claim 8, wherein the second controllable inductor and the first controllable inductor share a common core.

10. The crowbar circuit of claim 1, further comprising one or more of a high power dense energy storage circuit and an energy storage circuit.

11. The crowbar circuit of claim 1, further comprising an energy recovery for regenerating energy stored in a local bus, when the crowbar circuit is activated.

12. A method for controlling current in a crowbar circuit, the crowbar circuit including a controllable inductor and a load having a load capacitance and a load diode, the method comprising:
monitoring a current in the load capacitance and a current in the load diode;
when any of the currents in the load capacitance or the load diode exceeds a respective threshold value, reducing the current that exceeds the respective threshold value by increasing a value of the controllable inductor;
calculating a parameter for a safe operating area (SOA) of components of the load;
comparing the calculated parameter with a safety threshold; and
increasing a discharge current from the load capacitance or the load diode by decreasing the value of the controllable inductor.

13. The method of claim 12, further comprising transferring energy stored in a local bus to an energy storage, when the crowbar circuit is activated.

14. The method of claim 13, wherein the energy storage is one of more of external to the crowbar circuit and internal to the crowbar circuit.

15. A method for controlling current in a crowbar circuit, the crowbar circuit including a controllable inductor and a load having a load capacitance and a load diode, the method comprising:
turning on a first thyristor, when a surge current in an input power supply is detected;
discharging a current through the controllable inductor to dissipate the surge current;
turning on a second thyristor to turn off the first thyristor, when the surge current is dissipated below a predetermined threshold; and
transferring energy stored in a local bus to an energy storage, when the crowbar circuit is activated.

16. The method of claim 15, wherein the current through the controllable inductor is dynamically adjusted.

17. The method of claim 15, further comprising providing current to a gate drive of the first thyristor and a gate drive of the second thyristor to keep components of the load in a safe operation area, based on one or more of a current from the input power supply, a voltage across the input power supply, and an external command.

18. The method of claim 15, further comprising:
calculating a parameter for a safe operating area (SOA) of components of the load;
comparing the calculated parameter with a safety threshold; and
increasing a discharge current from the load capacitance or the load diode by decreasing the value of the controllable inductor.

19. The method of claim 15, wherein the controllable inductor includes a second controllable inductor with a coupling factor to the first controllable inductor.

* * * * *